(12) United States Patent
Yagi (10) Patent No.: US 6,828,688 B2
(45) Date of Patent: Dec. 7, 2004

(54) RESIN-SEALED SEMICONDUCTOR DEVICE, CIRCUIT MEMBER USED FOR THE DEVICE, AND METHOD OF MANUFACTURING THE CIRCUIT MEMBER

(75) Inventor: Hiroshi Yagi, Shinjuku-Ku (JP)

(73) Assignee: Dai Nippon Printing Co., Ltd. (JP)

( * ) Notice: Subject to any disclaimer, the term of this patent is extended or adjusted under 35 U.S.C. 154(b) by 97 days.

(21) Appl. No.: 09/959,660

(22) PCT Filed: Mar. 13, 2001

(86) PCT No.: PCT/JP01/01985

§ 371 (c)(1),
(2), (4) Date: Nov. 2, 2001

(87) PCT Pub. No.: WO01/69678

PCT Pub. Date: Sep. 20, 2001

(65) Prior Publication Data

US 2002/0158347 A1 Oct. 31, 2002

(30) Foreign Application Priority Data

Mar. 13, 2000 (JP) .................................. 2000-068290
Jun. 2, 2000 (JP) .................................. 2000-166377

(51) Int. Cl.[7] .............................................. H01L 23/28
(52) U.S. Cl. .......................... 257/787; 257/735; 257/672
(58) Field of Search ........................ 257/787, 762, 257/735, 670, 672, 747; 438/112, 124, 127

(56) References Cited

U.S. PATENT DOCUMENTS

| | | | | |
|---|---|---|---|---|
| 4,633,582 A | * | 1/1987 | Ching et al. ................... | 29/827 |
| 4,732,733 A | * | 3/1988 | Sakamoto et al. ........... | 420/485 |
| 6,114,755 A | * | 9/2000 | Ito et al. ...................... | 257/675 |
| 6,259,154 B1 | * | 7/2001 | Niwa ........................... | 257/678 |
| 6,410,979 B2 | * | 6/2002 | Abe ............................. | 257/684 |
| 6,583,512 B2 | * | 6/2003 | Nakaoka et al. ............. | 257/777 |
| 2001/0040300 A1 | * | 11/2001 | Huang et al. ................. | 257/787 |

FOREIGN PATENT DOCUMENTS

| | | |
|---|---|---|
| JP | 8-306853 | 11/1996 |
| JP | 9-17910 | 1/1997 |
| JP | 9-22975 | 1/1997 |
| JP | 11-251504 | 9/1999 |

* cited by examiner

Primary Examiner—Eddie Lee
Assistant Examiner—Douglas W. Owens
(74) Attorney, Agent, or Firm—Parkhurst & Wendel, L.L.P.

(57) ABSTRACT

A resin-encapsulated package includes a semiconductor IC chip, in which the ratio of the size of the semiconductor IC chip to the package size of the resin-encapsulated package including the semiconductor IC chip is large to miniaturize the resin-encapsulated package. The resin-encapsulated package is capable of dealing with increase in the operating speed of the semiconductor IC chip. The resin-encapsulated package includes a semiconductor IC chip (110) sealed in a resin molding, and a lead member (130B) having an arrangement of a plurality of discrete terminal sections (130A). Each of the terminal sections has inner terminal parts (131) to be electrically connected to terminals (115) of the semiconductor IC chip, outer terminal parts (132) to be connected to external circuits, and connecting parts (133) interconnecting the inner and the outer terminal parts. The inner and the outer terminal parts are formed such that the contact surfaces of the inner terminal parts and those of the outer terminal parts face toward opposite directions, respectively. The inner terminal parts and the connecting parts are thin, and the outer terminal parts are thick. The contact surfaces (131S) of the inner terminal parts of the terminal sections are flush with each other. A terminal-side surface of the semiconductor IC chip on the side of the terminals faces a surface of the lead member on the side of the contact surfaces of the inner terminal parts. The terminals of the semiconductor IC chip are joined to or in contact with the contact surfaces of the inner terminal parts of the lead member, and the terminals of the semiconductor IC chip are connected electrically to the inner terminal parts of the lead member.

1 Claim, 6 Drawing Sheets

RESIN-SEALED SEMICONDUCTOR DEVICE, CIRCUIT MEMBER USED FOR THE DEVICE, AND METHOD OF MANUFACTURING THE CIRCUIT MEMBER

TECHNICAL FIELD

The present invention relates to a resin-encapsulated package (hereinafter referred to simply as "plastic package") formed by sealing a semiconductor IC chip in a plastic molding. More particularly, the present invention relates to a plastic package having a small size and facilitating package mounting work, a lead member for the plastic package, and a method of fabricating the lead member.

BACKGROUND ART

Recently, the level of integration of semiconductor IC chips has progressively risen, techniques for device miniaturization have advanced and abilities of electronic equipment have been enhanced, and the miniaturization of semiconductor IC chips is the trend of the times. As represented by the development of ASICs, further increase in the number of components per chip and further improvement in performance are desired.

Activities for the development of plastic packages employing a lead frame trend from those for the development of surface-mount packages, such as SOJ packages (small outline J-leaded packages) and QFPs (quad flat packages), via those for the development and miniaturization of thin, small plastic packages, such as TSOPs (thin small outline packages) toward those for the development of LOC packages (lead-on-chip packages) to improve packaging efficiency through the three-dimensional arrangement of components in a package.

Further increase in the number of pins, further thickness reduction and further miniaturization have been required of plastic packages in addition to increase in the number of components and functional enhancement. A limit for the miniaturization of the conventional packages has come into view due to restrictions on the arrangement of leads around chips.

DISCLOSURE OF THE INVENTION

The present invention has been made under such circumstances to miniaturize a plastic package by increasing the ratio of the size of a semiconductor IC chip to the package size of the plastic package including the semiconductor IC chip and to provide a plastic package requiring a small area on a wiring board to increase plastic package mounting density on a wiring board.

According to the present invention, a plastic package having terminals including some exposed terminals includes: a semiconductor IC chip sealed in a resin molding, and a lead member having an arrangement of a plurality of discrete terminal sections; wherein each of the terminal sections has inner terminal parts to be electrically connected to terminals of the semiconductor IC chip, outer terminal parts to be connected to external circuits, and connecting parts interconnecting the inner and the outer terminal parts, the inner and the outer terminal parts are formed such that the contact surfaces of the inner terminal parts and those of the outer terminal parts face toward opposite directions, respectively, the inner terminal parts and the connecting parts are thin, and the outer terminal parts are thick, the contact surfaces of the inner terminal parts of the terminal sections are flush with each other, a terminal-side surface of the semiconductor IC chip on the side of the terminals faces a surface of the lead member on the side of the contact surfaces of the inner terminal parts, the terminals of the semiconductor IC chip are joined to or in contact with the contact surfaces of the inner terminal parts of the lead member, and the terminals of the semiconductor IC chip are connected electrically to the inner terminal parts of the lead member.

In the plastic package, the terminals of the semiconductor IC chip are provided with protruding electrodes, and the protruding electrodes are joined to or in contact with the contact surfaces of the inner terminal parts.

In the plastic package, the contact surfaces of the inner terminal parts are coated with connecting plated metal layers, respectively, and the terminals of the semiconductor IC chip and the inner terminal parts of the lead member are connected electrically through the plated metal layers, respectively.

In the plastic package, the plated metal layers are at least plated solder layers, plated gold layers, plated silver layers or plated palladium layers.

In the plastic package, the plated metal layers are formed on only parts of the contact surfaces of the inner terminal parts facing the terminals of the semiconductor IC chip.

In the plastic package, the contact surfaces of the inner terminal parts are coated with a conductive paste layer, the terminals of the semiconductor IC chip and the inner terminal parts of the lead member are connected electrically through the conductive paste layer.

In the plastic package, at least portions of the outer terminal parts are exposed on the resin molding or external electrodes of solder or the like are formed on the surfaces of the exposed portions of the outer terminal parts.

A lead member according to the present invention for a substantially flat plastic package including a semiconductor IC chip includes a plurality of discrete terminal sections, and a frame surrounding and holding the plurality of discrete terminal sections, wherein each of the terminal sections has inner terminal parts to be electrically connected to terminals of the semiconductor IC chip, outer terminal parts to be connected to external circuits, and connecting part interconnecting the inner and the outer terminal parts, the inner and the outer terminal parts are formed such that the contact surfaces of the inner terminal parts and those of the outer contact parts face toward opposite directions, respectively, the inner terminal parts and the connecting parts are thin, the outer terminal parts are thick, contact surfaces of the inner terminal parts of the terminal sections are flush with each other, the frame is provided with supporting parts other than the connecting parts, and the supporting parts are connected to the outer terminal parts, respectively.

Preferably, the lead member is formed by processing a metal sheet by a half-etching method.

In the lead member, the contact surfaces of the inner terminal parts are coated with connecting plated metal layers, respectively, and the terminals of the semiconductor IC chip and the inner terminal parts of the lead member are connected electrically through the plated metal layers, respectively, when assembling the lead member and the semiconductor IC chip.

In the lead member, the plated metal layers are at least plated solder layers, plated gold layers, plated silver layers or plated palladium layers.

In the lead member, the contact surfaces of the inner terminal parts are coated with conductive paste layers, respectively, the terminals of the semiconductor IC chip and the inner terminal parts of the lead member are connected electrically through the conductive paste layers, respectively.

In the lead member, the paste layers are formed of a Pb-free paste.

In this specification, the term "half-etching method" signifies an etching method including a half-etching process.

A method of fabricating a lead member as described above includes the step of processing a metal sheet by a half-etching method so that the surfaces of the inner terminal parts, the connecting parts and the supporting parts are portions of one of the surfaces of the metal sheet, the inner terminal parts, the connecting parts and the supporting parts have a thickness smaller than that of the metal sheet, and the outer terminal parts have a thickness equal to that of the metal sheet.

In the lead member fabricating method, plated metal layers are formed on the contact surfaces of the inner terminal parts, respectively.

The plated metal layer is formed by coating the surface of the lead member with a photoresist film, patterning the photoresist film to form openings in parts thereof corresponding to the contact surfaces of the inner terminal parts so that the contact surfaces of the inner terminal parts are exposed, and subjecting the lead member to a plating process using the patterned photoresist film as a mask to plate the exposed contact surfaces of the inner terminal parts.

In the lead member, the contact surfaces of the inner terminal parts are coated with paste layers, respectively.

In the lead member, the paste layers are formed by a printing method or a dispense method.

The plastic package of the present invention increases the ratio of an area occupied by the chip to the package size of the plastic package to miniaturize the plastic package. Thus the plastic package can be mounted on the wiring board in a small area to increase plastic package mounting density on the wiring board.

A ball grid array type plastic package can be formed by forming the outer electrodes in solder balls on the outer terminal parts.

More concretely, a lead member is formed by individually arranging a plurality of terminal sections each having thin inner terminal parts connected to the terminals of a semiconductor IC chip, thick outer terminal parts to be connected to an external circuit, and thin connecting parts interconnecting the inner and the outer terminal parts so that the contact surfaces of the inner terminal parts thereof face toward the same direction and extend flush with each other. The contact surfaces of the inner terminal parts and the contact surfaces of the outer terminal parts face toward opposite directions, respectively, and a surface of the lead member on the side of the inner terminal parts and a surface of the semiconductor IC chip on the side of the terminals face each other. The terminals of the semiconductor IC chip are joined to or in contact with the contact surfaces of the inner terminal parts of the lead member on the side of the terminals, and the terminals of the semiconductor IC chip are connected electrically to the inner terminal parts of the lead member.

The surfaces of the outer terminal parts protrude beyond the inner terminal parts and the connecting parts on a side of the lead member opposite a side on the side of the semiconductor IC chip, the surfaces of the outer terminal parts can be formed two-dimensionally in a plane parallel to the surfaces of the terminals of the semiconductor IC chip. Even if the number of the terminals of the semiconductor IC chip is increased and the pitches of the terminals are reduced, mounting on a practical level is possible.

In other words, further increase in the number of the pins of a plastic package can be achieved.

The CSP (chip size package) having a resin molding of dimensions substantially corresponding to the external dimensions of the semiconductor IC chip can be formed in a small size.

The plastic package can be formed in a small thickness and is satisfactory in heat dissipating performance when the outer terminal parts thereof are formed such that parts of the contact surfaces and side surfaces thereof are exposed.

The terminals of the semiconductor IC chip are arranged on a middle line between the opposite sides of the contact surface of the semiconductor IC chip, and the inner terminal parts of the lead member are arranged on lines extending in parallel to the middle line on the opposite sides of the middle line, respectively. Thus the plastic package is simple in construction and suitable for mass production.

The lead member of the present invention to be incorporated into the plastic package of the present invention can be formed by an ordinary etching method employing a half-etching process.

The lead member fabricating method of the present invention is capable of comparatively easily fabricating the lead member by the half-etching process and, consequently, the plastic package of the present invention can be fabricated.

BRIEF DESCRIPTION OF THE DRAWINGS

FIGS. 5(a) to 5(g) are views of assistance in explaining a lead member fabricating method in a preferred embodiment according to the present invention; and FIGS. 6(a) to 6(e) are views of assistance in explaining a method of fabricating the plastic package shown in FIG. 1.

BEST MODE FOR CARRYING OUT THE INVENTION

Preferred embodiments of the present invention will be described with reference to the accompanying drawings.

Figure 1A:
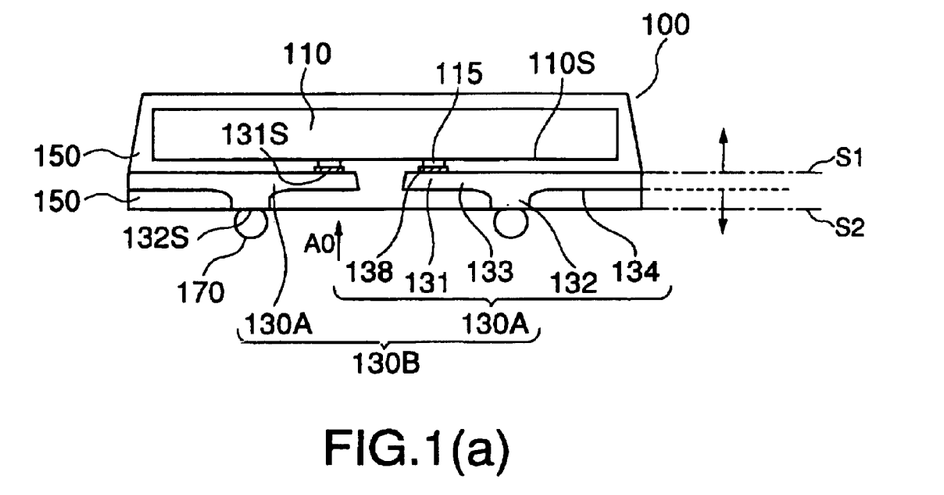
FIG. 1(a) is a schematic sectional view of a plastic package in a preferred embodiment according to the present invention.
Figure 1B:
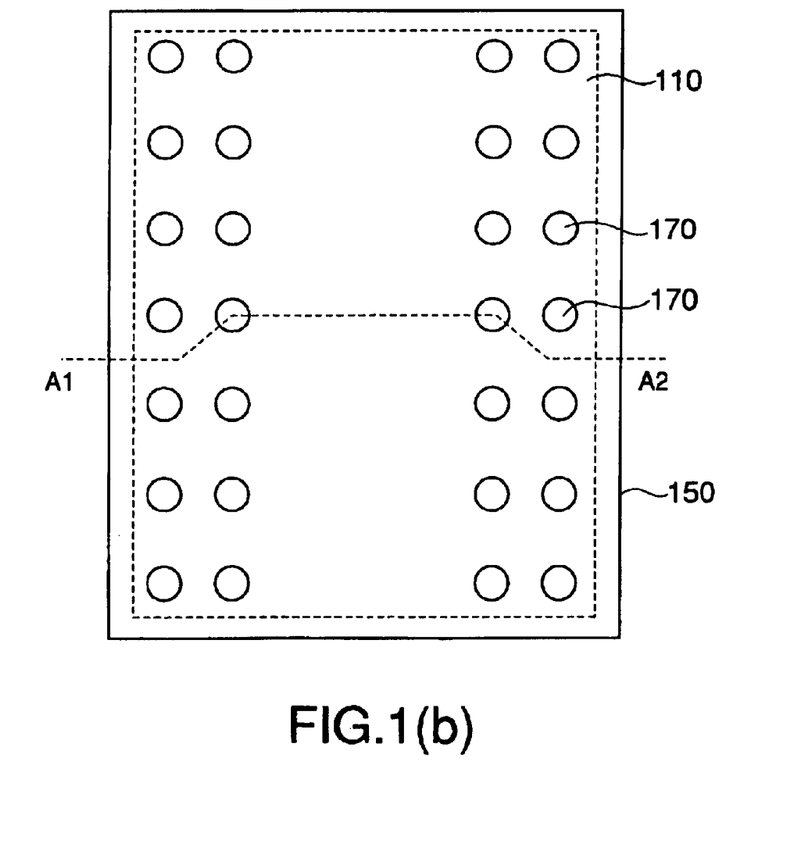
FIG. 1(b) is a bottom view of the plastic package shown in FIG. 1(a) taken from the side of external electrodes in the direction of the arrow AO in FIG. 1(a)
Figure 2:
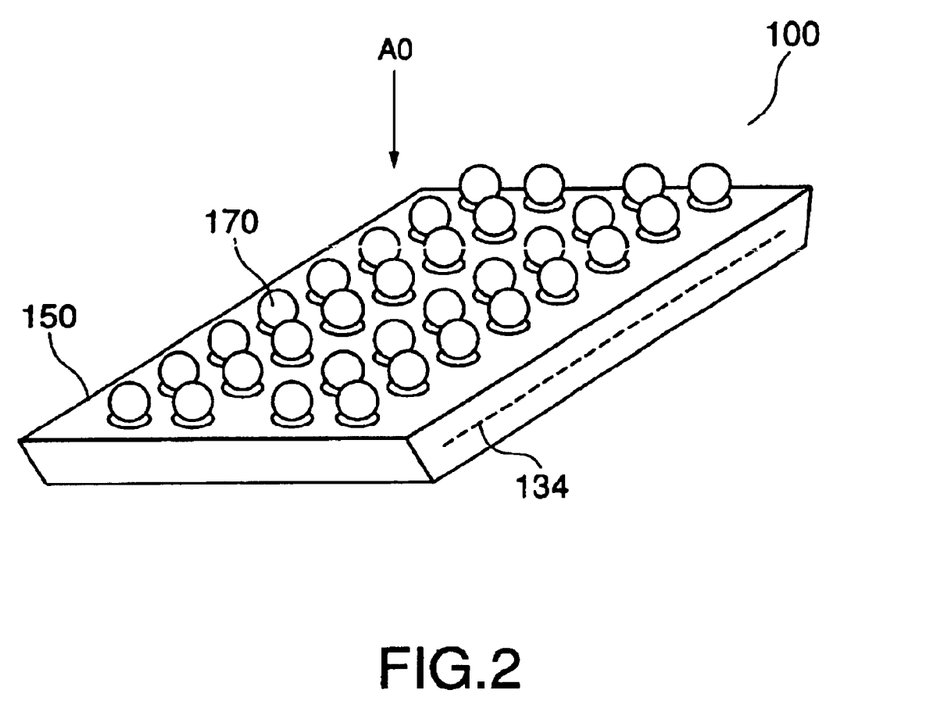
FIG. 2 is a perspective view of the plastic package shown in FIG. 1, showing external electrodes and side surfaces.
Figure 3:
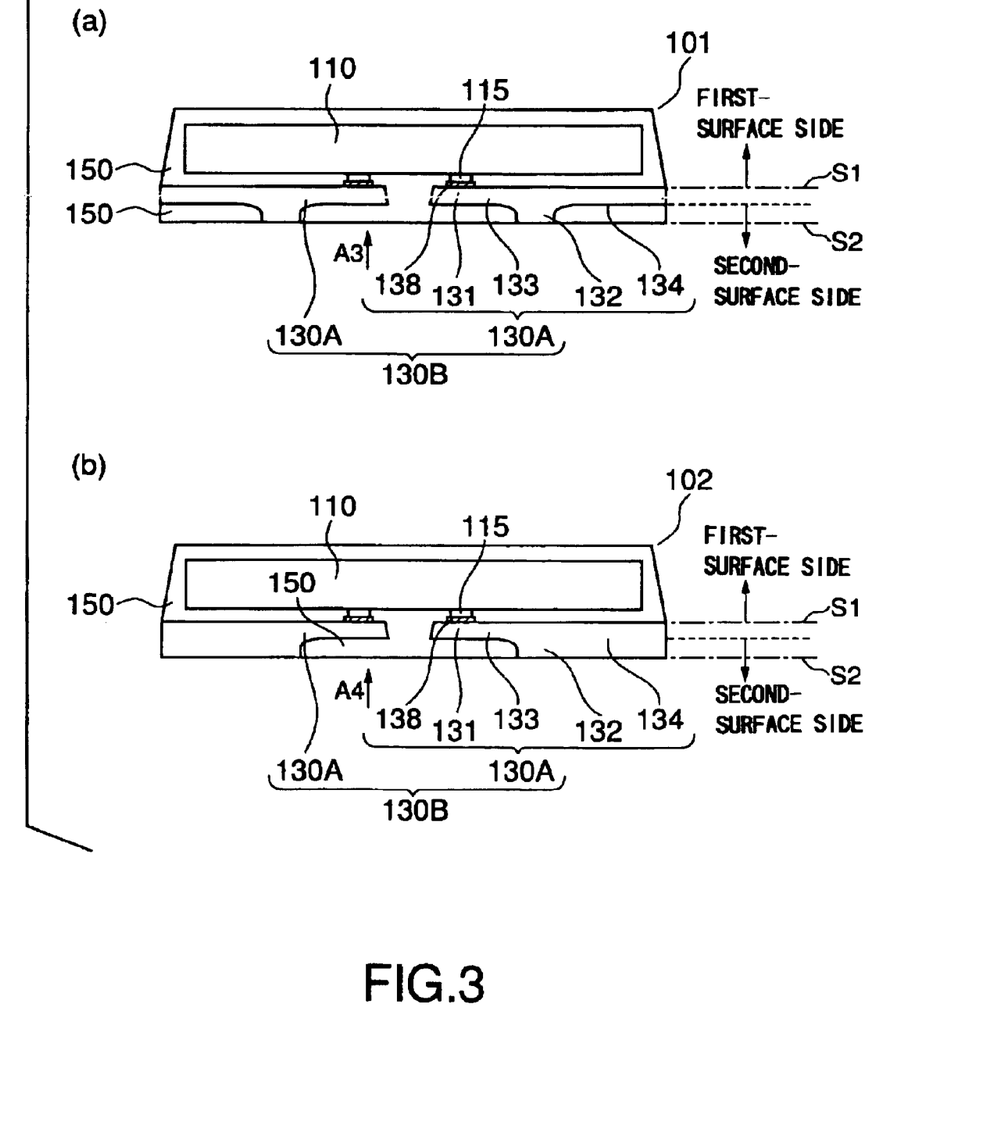
FIGS. 3(a) and 3(b) are schematic sectional views of plastic packages in modifications of the plastic package shown in FIG. 1.
Figure 4A:
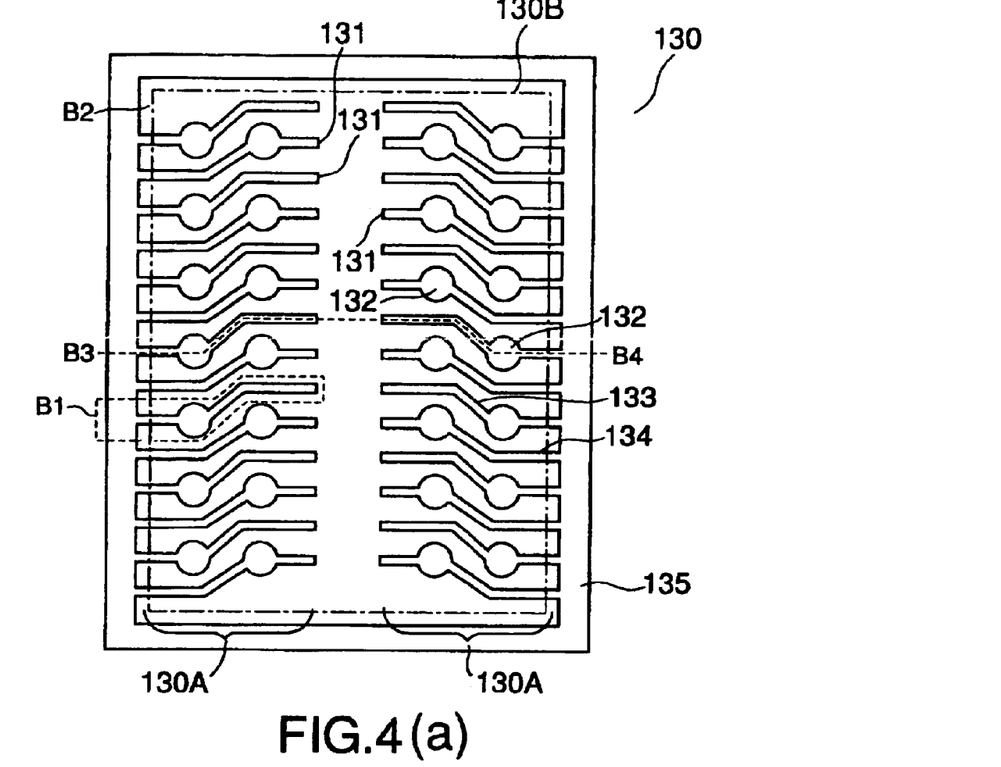
FIG. 4(a) is a schematic plan view of a lead member in a preferred embodiment according to the present invention.
Figure 4B:
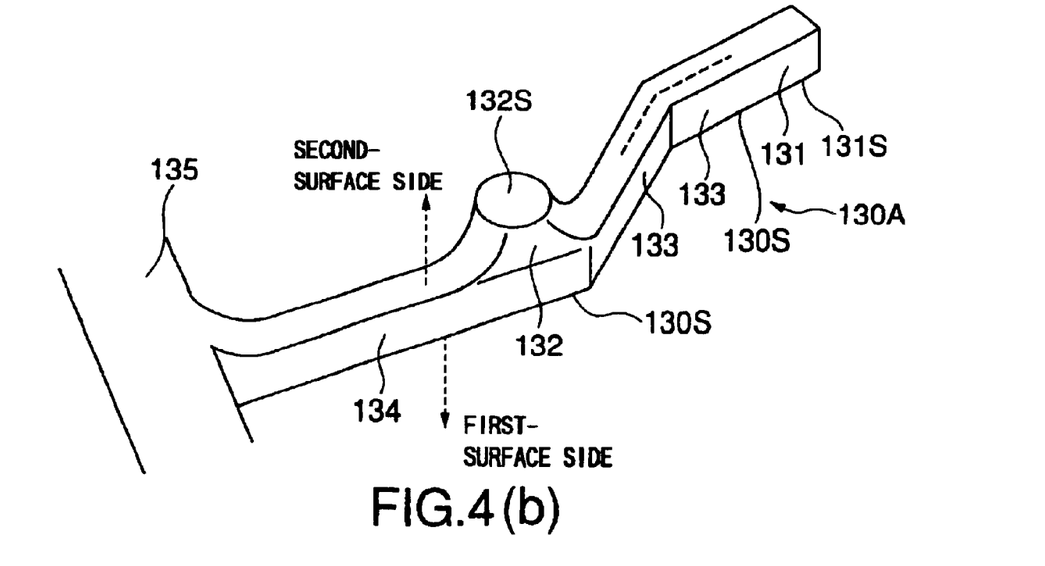
FIG. 4(b) is an enlarged perspective view of a portion B1 surrounded by dotted lines in FIG. 4(a)

FIG. 1(a) is a schematic sectional view of a plastic package in a preferred embodiment according to the present invention, FIG. 1(b) is a bottom view of the plastic package shown in FIG. 1(a) taken from the side of external electrodes in the direction of the arrow AO in FIG. 1(a), FIG. 2 is a perspective view of the plastic package shown in FIG. 1, showing external electrodes and side surfaces, FIGS. 3(a) and 3(b) are schematic sectional views of plastic packages in modifications of the plastic package shown in FIG. 1, FIG. 4(a) is a schematic plan view of a lead member in a preferred embodiment according to the present invention, FIG. 4(b) is an enlarged perspective view of a portion B1 surrounded by dotted lines in FIG. 4(a), FIGS. 5(a) to 5(g) are views of assistance in explaining a lead member fabricating method in a preferred embodiment according to the present invention, and FIGS. 6(a) to 6(e) are views of assistance in explaining a method of fabricating the plastic package shown in FIG. 1.

FIG. 1(a) is a sectional view taken on line A1–A2 in FIG. 1(b).

Shown in FIGS. 1 to 6 are plastic packages 100, 101 and 102, a semiconductor IC chip 110, a terminal-side surface 110S, terminals (pads) 115, a lead member 130, terminal sections 130A, a terminal assembly 130B, a surface 130S, a lead member 130a, inner terminal parts 131, contact surfaces 131S of the inner terminal parts 131, outer terminal parts 132, contact surfaces 132S of the outer terminal parts 132, connecting parts 133, supporting parts 134, a frame 135, plated metal layers 138, a resin molding 150, external electrodes 170 of solder, a metal sheet 510, resist films 520, patterned resist films 521 and 522, and thin parts 530.

The plastic package 100 in a preferred embodiment according to the present invention will be described with reference to FIGS. 1 and 2.

Referring to FIG. 1, the plastic package 100 is formed by sealing the semiconductor IC chip 110 in the resin molding 150 with parts (contact surfaces 132S) of the outer terminal parts 132 exposed in the lower surface of the resin molding 150. The external electrodes 170 of solder to be used for connecting the semiconductor IC chip 100 to circuits formed on a wiring board or the like are attached to the exposed contact surfaces 132S of the outer terminal parts 132. Only portions of the lead member 130 in a region B2 demarcated by chain lines in FIG. 4(a) are sealed in the resin molding 150, and portions of the lead member 130 outside the region B2 are cut and separated from the former portions sealed in the resin molding 150.

The plastic package 100 includes the semiconductor IC chip 110 sealed in the resin molding 150, and the terminal assembly 130B formed by separately arranging the terminal sections 130A. Each terminal section 130A has the inner terminal parts 131 to be electrically connected to the terminals 115 of the semiconductor IC chip 110, the outer terminal parts 132 to be connected to an external circuit, and the connecting parts 133 interconnecting the inner terminal parts 131 and the outer terminal parts 132, respectively. The contact surfaces 131S of the inner terminal parts 131 and the contact surfaces 132S of the outer terminal parts 132 face toward opposite directions, respectively. The inner terminal parts 131 and the connecting parts 133 are thin and the outer terminal parts 132 are thick.

The contact surfaces 131S of the inner terminal parts 131 of each terminal section 130A are included in a plane S1.

The plane S1 including the contact surfaces 131S of the inner terminal parts 131 of the terminal assembly 130B faces the terminal-side surface 110S on the side of the terminals 115 of the semiconductor IC chip 110.

The terminals 115 of the semiconductor IC chip 110 are joined to or in contact with the contact surfaces 131S of the inner terminal parts 131 of the terminal assembly 130B. Thus, the terminals 115 of the semiconductor IC chip 110 are connected electrically to the inner terminal parts 131 of the terminal assembly 130B.

As shown in FIG. 1(a), the outer terminal parts 132 having the contact surfaces 132S of the terminal assembly 130B protrude from a plane including the inner terminal parts 131 and the connecting parts 133 in a direction away from the semiconductor IC chip 110. The connecting surface 132S of each outer terminal part 132 extends two-dimensionally in a plane S2 parallel to the terminal-side surface 110S on the side of the terminals 115 of the semiconductor IC chip 110.

The supporting parts 134 of the lead member 130 shown in FIG. 4 remain in the plastic package 100.

The terminal assembly 130B includes portions of the lead member 130 in the region B2 demarcated by chain lines in FIG. 4(a).

In the plastic package 100, first surfaces of the components of the terminal assembly 130B are portions of the surface 130S (FIG. 4(b)) of a metal sheet from which the lead member 130 is made and are included substantially in the plane S1. The contact surfaces 131S of the inner terminal parts 131 are portions of the surface 130S of the metal sheet and are included in the plane S1.

In this embodiment, the contact surfaces 131S of the inner terminal parts 131 of the terminal assembly 130B are coated with the plated metal layer 138, respectively. The plated metal layers 138 coating the contact surfaces 131S of the inner terminal parts 131 are joined to the terminals 115 of the semiconductor IC chip 110.

The plated metal layers 138 are at least plated solder layers, plated gold layers, plated silver layers or plated palladium layers. The plated metal layers 138 are formed on the contact surfaces 131S of the inner terminal parts 131 of the terminal assembly 130B, and are joined to the terminals 115 of the semiconductor IC chip 110 by reflow soldering, metal-eutectic reaction or thermal compression bonding to connect the inner terminal parts 131 of the terminal assembly 130B to the terminals 115 of the semiconductor IC chip 110.

In the plastic package 100 shown in FIG. 1, the terminals 115 of the semiconductor IC chip 110 are arranged along a centerline extending in the middle between the opposite sides of the terminal-side surface 110S of the semiconductor IC chip 110. The inner terminal parts 131 are arranged in parallel to the centerline on the opposite sides of the centerline.

The plastic package 100 shown in FIG. 1 is a CSP (chip size package) having dimensions substantially corresponding to those of the semiconductor IC chip 110.

A plastic package in a modification of the plastic package 100 shown in FIG. 1 employs a lead member having a terminal assembly 130B including inner terminal parts 131 having connecting surfaces 131S respectively coated with connecting paste layers. The contact surfaces 131S of the inner terminal parts 131 of the terminal assembly 130B are connected to the terminals 115 of the semiconductor IC chip 110 with the bonding paste layers. Preferably, the bonding paste layers are formed of a Pb-free bonding paste.

The plastic package of the present invention is not limited to the plastic package 100 of a CSP type shown in FIG. 1.

A plastic package 101 in a modification shown in FIG. 3(a) is not provided with any external electrodes corresponding to the external electrodes of solder of the plastic package 100 shown in FIG. 1.

A plastic package 102 in another modification shown in FIG. 3(b) is provided with a lead member 130 having outer terminal parts 132 and supporting parts 134. Both the outer terminal parts 132 and the supporting parts 134 have the same thickness equal to that of a metal sheet from which the lead member 130 is formed.

The plastic package 102 is superior in heat dissipating ability to the plastic package 100. However, cutting and separating a frame 135 of the lead member 130 is somewhat difficult.

The terminal assembly 130B is formed of a Ni—Fe alloy, such as a Ni(42%)—Fe alloy, or a copper alloy.

A lead member 130 in a preferred embodiment according to the present invention will be described with reference to FIG. 4.

As mentioned above, the region B2 demarcated by chain lines in FIG. 4(a) is sealed in a resin molding when forming a plastic package employing a lead member 130, and portions of the lead member 130 outside the region B2 are cut and removed.

The lead member 130 has a generally flat shape and is employed in the plastic package 100 shown in FIG. 1. The contact surfaces 131s of inner terminal parts 131 are not coated with plated metal layers 138.

As shown in FIGS. 4(a) and 4(b), the lead member 130 includes discrete terminal sections 130A, and a frame 135 surrounding and holding the terminal sections 130A. Each terminal section 130A has inner terminal parts 131 to be electrically connected to the terminals 115 of the semiconductor IC chip 110 as shown in FIG. 1, outer terminal parts 132 to be connected to an external circuit, and connecting parts 133 interconnecting the inner terminal parts 131 and the outer terminal parts 132, respectively. The contact surfaces 131S of the inner terminal parts 131 and the contact surfaces 132S of the outer terminal parts 132 face toward opposite directions, respectively. The inner terminal parts 131 and the connecting parts 133 are thin and the outer terminal parts 132 are thick. The contact surfaces 131S of the inner terminal parts 131 of each terminal section 130A are included in a plane S1. The frame 135 is connected to the outer terminal parts 132 by supporting parts 134 to hold the terminal sections 130A.

As shown in FIG. 4(b), the outer terminal parts 132 having the contact surfaces 132S of the terminal assembly 130D protrude from a plane including the inner terminal parts 131 and the connecting parts 133 in a direction away from the semiconductor IC chip 110. The connecting surface 132S of each outer terminal part 132 extends two-dimensionally in a plane S2 parallel to the terminal-side surface 110S on the side of the terminals 115 of the semiconductor IC chip 110.

A surface of the lead member 130 facing the terminals of the semiconductor IC chip 110, i.e., a first surface in FIG. 1(a), is the surface 130S of a metal sheet from which the lead member 130 is made.

The lead member 130 is formed of a Ni—Fe alloy, such as a Ni(42%)—Fe alloy, or a copper alloy. The lead member 30, similarly to ordinary lead frames, may be shaped by etching.

A lead member 130 obtained by coating the contact surfaces 131S of the inner terminal parts 131 of the lead member 130 shown in FIG. 4 with a plated metal layer 138 for connecting the inner terminal parts 131 of the lead member 130 and the terminals 115 of the semiconductor IC chip 110 is employed in the plastic package 100 shown in FIG. 1.

The plated metal layers for connecting the inner terminal parts of the lead member to the terminals of the semiconductor IC chip are at least plated solder layers, plated gold layers, plated silver layers, plated palladium layers or plated silver-tin layers.

It is possible to employ a lead member 130, similarly to the lead member 130 shown in FIG. 4, provided with inner terminal parts 131 having contact surfaces 131S coated with a paste layer for connecting the inner terminal parts 131 of the lead member 130 to the terminals 115 of the semiconductor IC chip 110.

The foregoing plastic package in the modification employs this lead member.

A method of fabricating the lead member 130 shown in FIG. 4 will be described by way of example with reference to FIG. 5.

Figure 5:
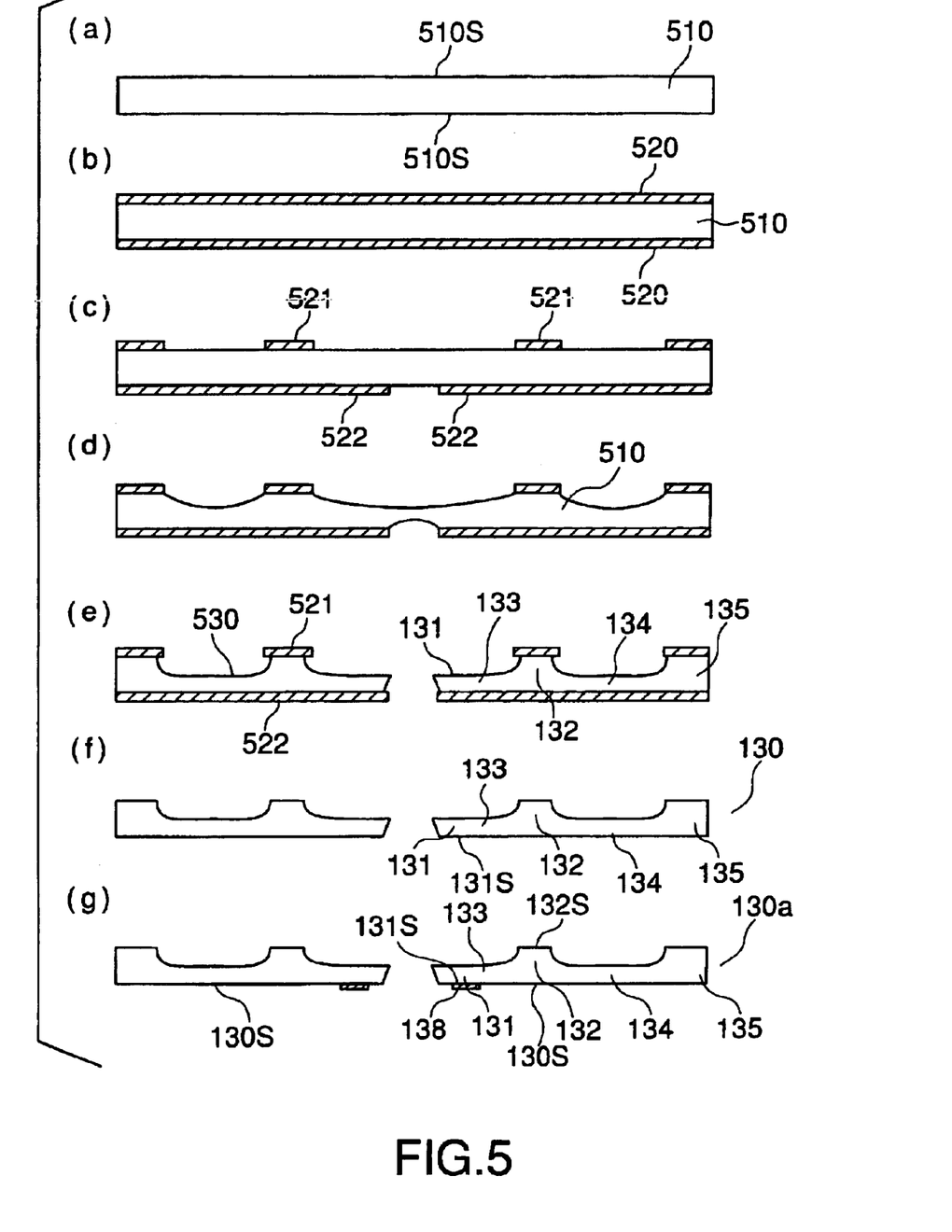

FIG. 5 shows only a section on line B3–B4 in FIG. 4(a) to facilitate understanding the explanation.

A metal sheet 510 of about 0.2 mm in thickness of a 42-alloy (Ni(42%)—Fe alloy) or a copper alloy as shown in FIG. 5(a) is used for forming the lead member 130. Both the surfaces of the metal sheet 510 are degreased and cleaned. Then a photoresist is applied to both the surfaces of the metal sheet 510 in films and the films are dried to form photoresist layers 520 as shown in FIG. 5(b).

Both the surfaces of the metal sheet 510 coated with the photoresist layers 520 are covered with masks of predetermined patterns, the photoresist layers 520 are exposed to light through the masks, the exposed photoresist layers 520 are developed to form etching masks 521 and 522 of predetermined patterns as shown in FIG. 5(c).

Regions of one of the surfaces of the metal sheet 510 corresponding to the inner terminal parts, connecting parts and the supporting parts are not coated with the photoresist.

Although there are not any particular restrictions on the photoresist, casein resist containing potassium dichromate as a photosensitive agent or a liquid negative resist, such as PMER® commercially available from Tokyo Ouka K. K., may be used.

Then, both the surfaces of the metal sheet 510 is etched by an etching process using the etching masks 521 and 522.

Depths of etched portions in both the surfaces of the metal sheet 510 are adjusted to adjust the thickness of thin parts 530.

Usually, an aqueous solution of ferric chloride is used as an etchant. The etchant is sprayed on both the surfaces of the metal sheet.

FIG. 5(d) shows a state of the metal sheet 510 during the etching process. As the etching process is continued further, a portion of the metal sheet 510 between the opposite inner terminal parts 131 is removed, inner terminal parts 131, connecting parts 133 and supporting parts 134 are formed in a thickness smaller than that of the metal sheet 510, and outer terminal parts 132 and a frame 135 are formed in a thickness equal to that of the metal sheet 510 as shown in FIG. 5(e). A portion of the surface 510S of the metal sheet 510 forms one of the surfaces of each of the inner terminal parts 131, the connecting parts 133 and the supporting parts 134.

After the completion of the etching process, the etching masks are removed as shown in FIG. 5(f) to obtain a lead member 130 as shown in FIG. 4.

Subsequently, the contact surfaces of the inner terminal parts of the lead member 130 are plated to obtain a lead member 130a having the inner terminal parts having the contact surfaces coated, respectively, with plated metal layers 138 as shown in FIG. 5(g) for the plastic package shown in FIG. 1.

The plated metal layers 138 formed on the contact surfaces of the inner terminal parts 131 of the lead member 130 are at least plated solder layers, plated gold layers, plated silver layers or plated palladium layers.

A photoresist mask is used to plate only the contact surfaces of the inner terminal parts 131.

Connecting paste layers for connecting the inner terminal parts 131 and the terminals of the semiconductor IC chip may be formed on the contact surfaces of the inner terminal parts of the lead member 130 by a printing method or a dispense method to obtain the aforesaid lead member in the modification.

A method of fabricating the plastic package 100 shown in FIG. 1 will be briefly described with reference to FIG. 6.

The lead member 130a shown in FIG. 4 is fabricated by the method previously described with reference to FIG. 5 (FIG. 6(a)).

Then, a semiconductor IC chip 110 and the lead member 130a are disposed with the contact surfaces 131S of the inner terminal parts 131 of the terminal assembly 130B facing the terminal-side surface on the side of the terminals 115 of the semiconductor IC chip 110.

The terminals 115 of the semiconductor IC chip 110 are joined to or in contact with the contact surfaces 131S of the inner terminal parts 131 of the terminal assembly 130B. Thus, the terminals 115 of the semiconductor IC chip 110 are connected electrically to the inner terminal parts 131 of the terminal assembly 130B by reflow soldering, metal-eutectic reaction or thermal compression bonding as shown in FIG. 6(b).

Then, the semiconductor IC chip 110 and the lead member 130a are sealed in a resin molding 150 with the outer terminal parts 132 exposed partly as shown in FIG. 6(c).

The exposed contact surfaces 132S of the outer terminal parts 132 are subjected to a surface treatment, such as solder plating, and external electrodes 170, such as solder balls, are formed on the exposed surfaces 132S of the outer terminal parts 132 as shown in FIG. 6(d).

Then, the supporting parts 134 of the lead member 130 are cut by pressing to remove the frame 135 as shown in FIG. 6(e).

The external electrodes 170, i.e., solder balls, may be formed by any method, such as a screen printing method using a solder paste or reflow soldering method, provided that the external electrodes 170 each of an amount of solder necessary for joining the plastic package to a wiring board.

EXAMPLES

The present invention will be described in terms of examples thereof.

Example 1

Figure 6:
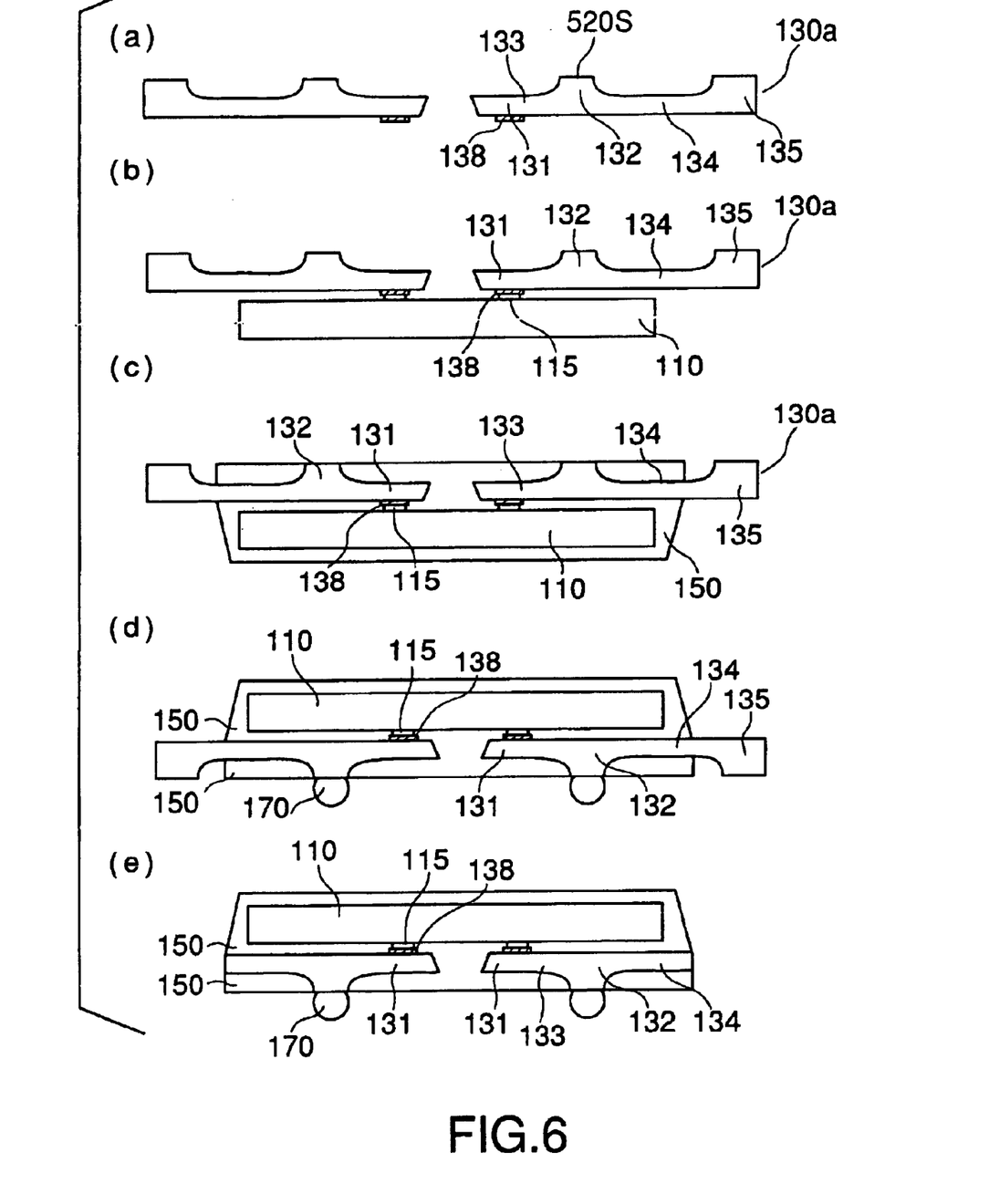

A plastic package in Example 1 was made, similarly to the plastic package shown in FIG. 1, by fabricating the lead member shown in FIG. 4 (FIG. 5(f)) by the lead member fabricating method shown in FIG. 5, and by the plastic package fabricating method shown in FIG. 6 using the lead member having inner terminal parts having the contact surfaces respectively coated with the plated metal layers (FIG. 6(g)).

The lead member 130a was fabricated by the following method, which will be described with reference to FIG. 5.

Both the surfaces of a 0.15 mm thick metal sheet 510 of the 42-alloy (Ni(42%)—Fe alloy) were degreased and cleaned (FIG. 5(a)). Then, a negative photoresist, i.e., negative photoresist PMER® commercially available from Tokyo Ouka K. K., was applied to both the surfaces of the metal sheet 510 in films and the films were dried to form photoresist layers 520 (FIG. 5(b)).

Both the surfaces of the metal sheet 510 coated with the photoresist layers 520 were covered with masks of predetermined patterns (photomasks), the photoresist layers 520 were exposed to light through the masks, the exposed photoresist layers 520 were developed to form etching masks 521 and 522 of predetermined patterns (FIG. 5(c)).

Both the surfaces of the metal sheet 510 were etched by a spray etching method using a ferric chloride etchant and the etching masks 521 and 522 (FIGS. 5(d) and 5(e)). After the completion of the etching process, the etching masks 521 and 522 were removed by an etching mask removing process using a proper alkaline remover, and the metal sheet 510 was cleaned to obtain a lead member 130 shown in FIG. 4 (FIG. 5(f)).

Subsequently, the entire surface of the lead member 130 was coated with an electrodeposition resist film by an electrodeposition process, the electrodeposition resist film was exposed to light through a mask of a predetermined pattern corresponding to the pattern of plated metal layers to be formed on the contact surfaces 131S of the inner terminal parts 131, the exposed electrodeposition resist film was developed to form a plating mask of the electrodeposition resist having openings corresponding to the pattern of the plated meal layers. Then the lead member 130 coated with the plating mask was subjected to a solder plating process to form plated solder layers, i.e., plated metal layers, on portions of the contact surfaces 131S of the inner terminal parts 131 corresponding to the openings in the plating mask. Then, the plating mask was removed by a plating mask removing process using a proper remover to obtain a lead member 130a (FIG. 5(g)).

A high-temperature solder (90% Pb) was used for solder plating.

An electrodeposition liquid for forming the electrodeposition film, and the remover for removing the electrodeposition film are those represented by those for eagle process commercially available from Shipray.

The inner terminal parts 131 of the lead member 130a (FIG. 6(a)) thus fabricated and the terminals 115, i.e., metal bumps, of the semiconductor IC chip 110 were bonded together with the plated solder layers 138 formed on the lead member 130 by flip-chip solder bonding to form an assembly of the semiconductor IC chip 110 and the lead member 130a (FIG. 6(b)). The assembly was sealed in a resin molding (FIG. 6(c)).

The resin molding was formed by molding an epoxy resin in a predetermined mold.

Subsequently, solder balls were attached to the outer terminal parts 132 to form external electrodes 170 (FIG. 6(d)). Then, supporting parts 134 of the lead member 130a were cut by pressing to remove a frame 135 to complete a plastic package as shown in FIG. 1 (FIG. 6(e)).

Example 2

A lead member 130 shown in FIG. 4 was fabricated by processing a 0.15 mm thick metal sheet 510 of the 42-alloy (Ni(42%)—Fe alloy) by the lead member fabricating method shown in FIG. 5. A lead member 130a was obtained by coating the contact surfaces of inner terminal parts of the lead member 130 with films of a conductive paste by a screen printing method (FIGS. 5(g) and 6(a)).

An Ag—Sn paste was used as the conductive paste.

Subsequently, the inner terminal parts of the lead member 130a (FIG. 6(a)) thus fabricated and a semiconductor IC chip 110 provided with gold bumps (terminals 115) were bonded together with the films of the conductive paste by a flip-chip solder bonding method (FIG. 6(b)) to obtain an assembly of the lead member 130 and the semiconductor IC chip 110. Then, the assembly was sealed in a resin molding (FIG. 6(c)).

The resin molding was formed by molding an epoxy resin in a predetermined mold.

Subsequently, solder balls were attached to the outer terminal parts 132 to form external electrodes 170 (FIG. 6(d)). Then, supporting parts 134 of the lead member 130a were cut by pressing to remove a frame 135 to complete a plastic package as shown in FIG. 1 (FIG. 6(e)).

As apparent form the foregoing description, under circumstances where further increase in the number of components per chip and further improvement in performance are desired, the present invention provides a plastic package capable of increasing the ratio of the size of the semiconductor IC chip to the that of the plastic package, meeting demand for miniaturization, requiring a small mounting area on a wiring board, and capable of increasing packaging density.

What is claimed is:

1. A lead member fabricating method of fabricating a lead member for a substantially flat resin-encapsulated package including a semiconductor IC chip, having a plurality of discrete terminal sections, and a frame surrounding and holding the plurality of discrete terminal sections, wherein each of the terminal sections has inner terminal parts to be electrically connected to terminals of the semiconductor IC chip, outer terminal parts to be connected to external circuits, and connecting parts interconnecting the inner and the outer terminal parts, respectively, the inner and the outer terminal parts are formed such that contact surfaces of the inner terminal parts and those of the outer terminal parts face toward opposite directions, respectively, the inner terminal parts and the connecting parts are thin, the outer terminal parts are thicker than the inner terminal parts and the connecting parts, the contact surfaces of the inner terminal parts of the terminal sections are flush with each other, the frame is provided with supporting parts other than the connecting parts, and the supporting parts are connected to the outer terminal parts;

said lead member fabricating method comprising processing a metal sheet by a half-etching method so that surfaces of the inner terminal parts, the connecting parts and the supporting parts are portions of one of the surfaces of the metal sheet, the inner terminal parts, the connecting parts and the supporting parts have a thickness smaller than that of the metal sheet, and the outer terminal parts have a thickness equal to that of the metal sheet, wherein plated metal members are formed on the contact surfaces of the inner terminal parts, the plated metal layers being formed by coating the surface of the lead member with a photoresist film, the photoresist being an electrodeposition resist film, patterning the photoresist film to form openings in the parts thereof corresponding to the contact surfaces of the inner terminal parts so that the contact surface of the inner terminal parts are exposed, and subjecting the lead member to a plating process using the patterned photoresist film as a mask to plate the exposed contact surfaces of the inner terminal parts.

* * * * *